United States Patent [19]
Balakrishnan

[11] Patent Number: 5,282,107
[45] Date of Patent: Jan. 25, 1994

[54] POWER MOSFET SAFE OPERATING AREA CURRENT LIMITING DEVICE

[75] Inventor: Balu Balakrishnan, Saratoga, Calif.

[73] Assignee: Power Integrations, Inc., Mountain View, Calif.

[21] Appl. No.: 938,705

[22] Filed: Sep. 1, 1992

[51] Int. Cl.$^5$ .................................. H02H 7/122
[52] U.S. Cl. ............................ 361/18; 361/86; 323/274; 363/56
[58] Field of Search ................. 361/18, 91, 86; 323/274, 273; 363/56

[56] References Cited

U.S. PATENT DOCUMENTS

| | | | |
|---|---|---|---|
| 4,893,158 | 1/1990 | Mihara et al. | 361/91 |
| 5,086,364 | 2/1992 | Leipold et al. | 361/18 |
| 5,164,659 | 11/1992 | Schultz et al. | 361/18 |

Primary Examiner—Todd DeBoer
Attorney, Agent, or Firm—Thomas E. Schatzel

[57] ABSTRACT

An embodiment of the present invention is a switching power supply that includes a full-wave bridge rectifier to rectify incoming AC line voltage, a transformer having a primary winding and two secondary windings and a switched mode power supply chip that includes an integrated high voltage power MOSFET with a low voltage tap in the drift region. The MOSFET controls power switching of the primary winding of the transformer and has a high voltage present during initial power-up. This high voltage is dropped across the JFET part of the MOSFET and supplies a safe operating area protection circuit with a low voltage signal that will shut-off the MOSFET if the current passing through the MOSFET produces a voltage drop at the tap that exceeds a predetermined maximum.

5 Claims, 3 Drawing Sheets

POWER MOSFET SAFE OPERATING AREA CURRENT LIMITING DEVICE

BACKGROUND OF THE INVENTION

1. Field of the Invention

The present invention relates to semiconductor transistors and specifically to protecting power MOSFETs from exceeding their safe operating areas.

2. Description of the Prior Art

Switched mode power supplies, almost by definition, use a high-voltage, high-current MOSFET to switch current on and off in the primary winding of an output transformer. To protect the MOSFET, and to indirectly measure the load on the output transformer, a sense resistor is typically placed between the source of the MOSFET and ground. This practice may appear contradictory in view of the fact that semiconductor process engineers expend much effort into producing such transistors with very low values of drain on resistance ($R_{DON}$). A voltage develops across the sense resistor that is proportional to the current, and this sense voltage can then be used by a comparator to turn off the MOSFET when the current exceeds a preset limit and to control output power levels with a closed-loop feedback servo.

A conventional way of implementing a current limiting circuit is illustrated in FIG. 1. A prior art power supply 10 includes an output transformer 12 with a primary winding 14, and a switched mode power supply chip 16 that comprises a pulse width modulation (PWM) circuit 18, a high-voltage MOSFET 20, a sense resistor 22 and a current-limit comparator 24. An over-current condition causes a voltage drop across resistor 22 to exceed a predetermined threshold voltage (Vth) at comparator 24. The output voltage of comparator 24 will cause a flip-flop 26 to reset, thus lowering the Q-output and turning off MOSFET 20 and interrupting the current flow through primary winding 14.

Resistor 22 preferably has a value equal to a fraction of a ohm. Unfortunately, precision, low value resistors are difficult to fabricate in integrated circuits. The value of resistor 22 adds to the $R_{on}$ of MOSFET 20. With resistor 22 at a low value of resistance, the voltage developed across it will be proportionately small, and the comparator threshold voltage Vth is susceptible to being buried or confused with ground noise. Noise immunity figures therefore suffer. Any current limit value must be set at some margin below the device destruction current level ($I_{DSS}$) of MOSFET 20 to assure that MOSFET 20 does not go into saturation before such destructive current is reached. Otherwise, voltages across a saturated MOSFET 20 can reach levels that exceed the device safe operating area. Therefore, the current limit is conventionally set well below the $I_{DSS}$ value, in order to allow for process variations of $I_{DSS}$ and comparator threshold tolerances. Consequently, device maximum operating currents are artificially limited and larger, more expensive MOSFETs must be used in compensation.

A part of the source area of MOSFET 20 may be used as a sense FET to indirectly sense the total current. In FIG. 2, a prior art power supply 30 includes an output transformer 32 with a primary winding 34, and a switched mode power supply chip 36 that comprises a pulse width modulation (PWM) circuit 38, a high-voltage MOSFET 40, a sense resistor 42 and a current-limit comparator 44. An over-current condition causes a voltage drop across resistor 42 to exceed a predetermined threshold voltage (Vth) at comparator 44. The output of comparator 44 will cause a flip-flop 46 to reset, thus lowering the Q-output and turning off MOSFET 40 and interrupting the current flow through primary winding 34. The technique of using two sources in MOSFET 40 can overcome many of the disadvantages mentioned in connection with power supply 10. Resistor 42 can be larger in value than resistor 22 and a higher threshold voltage Vth can be used in power supply 30 without sacrificing performance. However, the ratio of the sense current to total current in MOSFET 40 is only accurate when the on-drain voltage is large compared to the voltage Vth. In actual practice, the drain voltage is usually designed to be low to keep losses to a minimum. Therefore, a much larger margin is needed for the current limit to guarantee that MOSFET 40 will not be destroyed before the protection circuit operates. Consequently, device maximum operating currents are even more artificially limited and still larger, more expensive MOSFETs must be used in compensation for power supply 30.

In FIG. 3, a prior art power supply 50 includes an output transformer 52 with a primary winding 54, and a switched mode power supply chip 56 that comprises a pulse width modulation (PWM) circuit 58, a high-voltage MOSFET 60, a current-limit comparator 62 and an AND-gate 64. The voltage on the drain of MOSFET 60 can be sampled during the periods MOSFET 60 is on to sense an over current condition. AND-gate 64 will only allow comparator 62 to switch off MOSFET 60 if the comparison at the inputs of comparitor 62 is being made when the gate of MOSFET 60 is high. The drain on resistance ($R_{DON}$) of MOSFET 60 is equivalent to using a sense resistor. It is possible with this circuit configuration to detect when MOSFET 60 is going into saturation, thus making it possible to protect it from safe operating area failure. Power supply 50 is relatively insensitive to process variations of $I_{DSS}$ for MOSFET 60 and in threshold voltage Vth. Operation closer to the maximum current capability of MOSFET 60 is possible because smaller safety margins are possible. Unfortunately, the drain of MOSFET 60 is a high voltage pin and that makes it very difficult to design a circuit for comparator 62 that can withstand the voltage when MOSFET 60 is off. This is particularly true from a monolithic chip implementation. Even if the obstacles are overcome, the implementation of such a high voltage circuit to sense drain voltage requires an excessive amount of chip area.

SUMMARY OF THE PRESENT INVENTION

It is therefore an object of the present invention to provide a switched mode power supply chip that eliminates the sense resistor and high voltage circuit requirements for a current limiter.

Briefly, an embodiment of the present invention is a switching power supply that includes a full-wave bridge rectifier to rectify incoming AC line voltage, a transformer having a primary winding and two secondary windings and a switched mode power supply chip that includes an integrated high voltage power MOSFET with a low voltage tap in the drift region. In operation, the MOSFET controls power switching of the primary winding of the transformer and has a high voltage present during initial power-up. This high voltage is dropped across the JFET part of the MOSFET and supplies a safe operating area protection circuit with a low voltage signal that will shut-off the MOSFET if the current passing through the MOSFET produces a voltage drop at the tap that exceeds a predetermined maximum.

An advantage of the present invention is that an integrated circuit is provided that provides effective over-current protection using simple non-precision circuitry in smart power ICs that combine high voltage MOSFETs with control circuitry, such as a switching regulator chip with an integrated power switch.

A further advantage of the present invention is that an integrated circuit is provided that requires less chip area than the prior art.

An advantage of the present invention is that an integrated circuit is provided that is relatively insensitive to process variations in MOSFET switch parameters.

Another advantage of the present invention is that an integrated circuit is provided that allows operation up to the maximum current capability of a high voltage MOSFET switch, while providing safe operating area protection.

A further advantage of the present invention is that an integrated circuit is provided that eliminates a current sense input pin that would otherwise be required for an external current limit sense resistor.

Another advantage of the present invention is that an integrated circuit is provided that allows implementation of a simple fully integrated power supply chip with a minimum of package input/output pins and external components.

These and other objects and advantages of the present invention will no doubt become obvious to those of ordinary skill in the art after having read the following detailed description of the preferred embodiment which is illustrated in the various drawing figures.

IN THE DRAWINGS

FIG. 5 is a graph of the drain current versus the drain voltage of a MOSFET included in the power supply of FIG. 4 when the MOSFET is on.

DETAILED DESCRIPTION OF THE EMBODIMENTS

Figure 1:
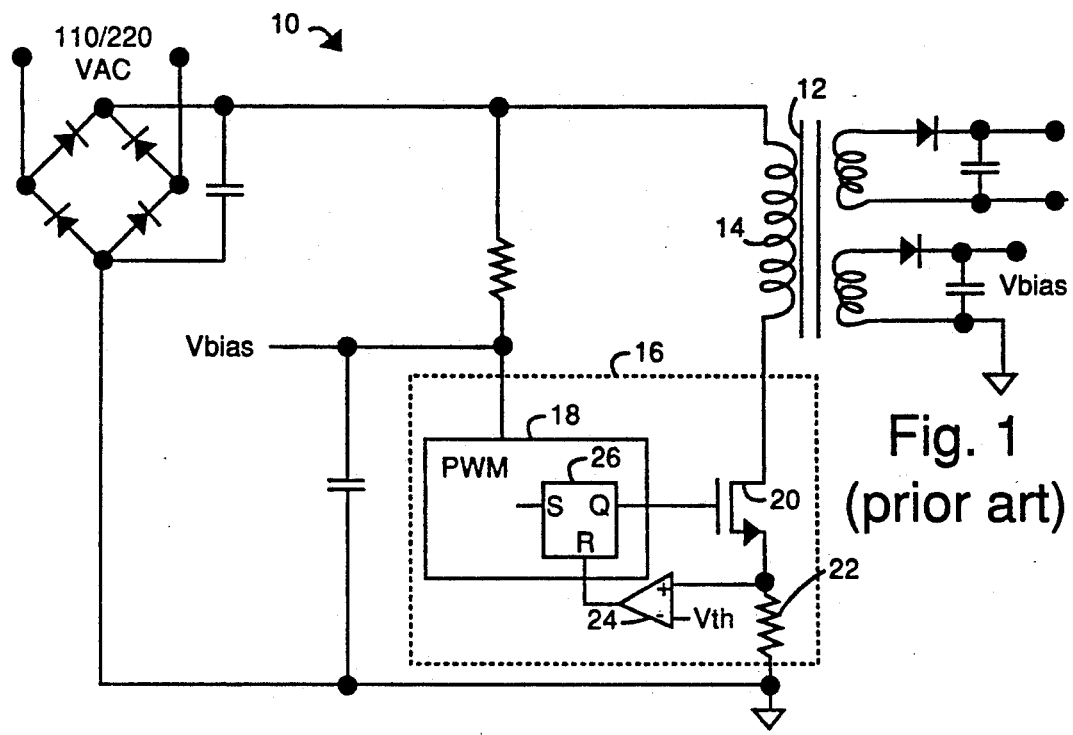
FIG. 1 is a schematic diagram of a prior art power supply that includes a sense resistor in series with the source of a power switching MOSFET to implement safe operating area protection.
Figure 2:
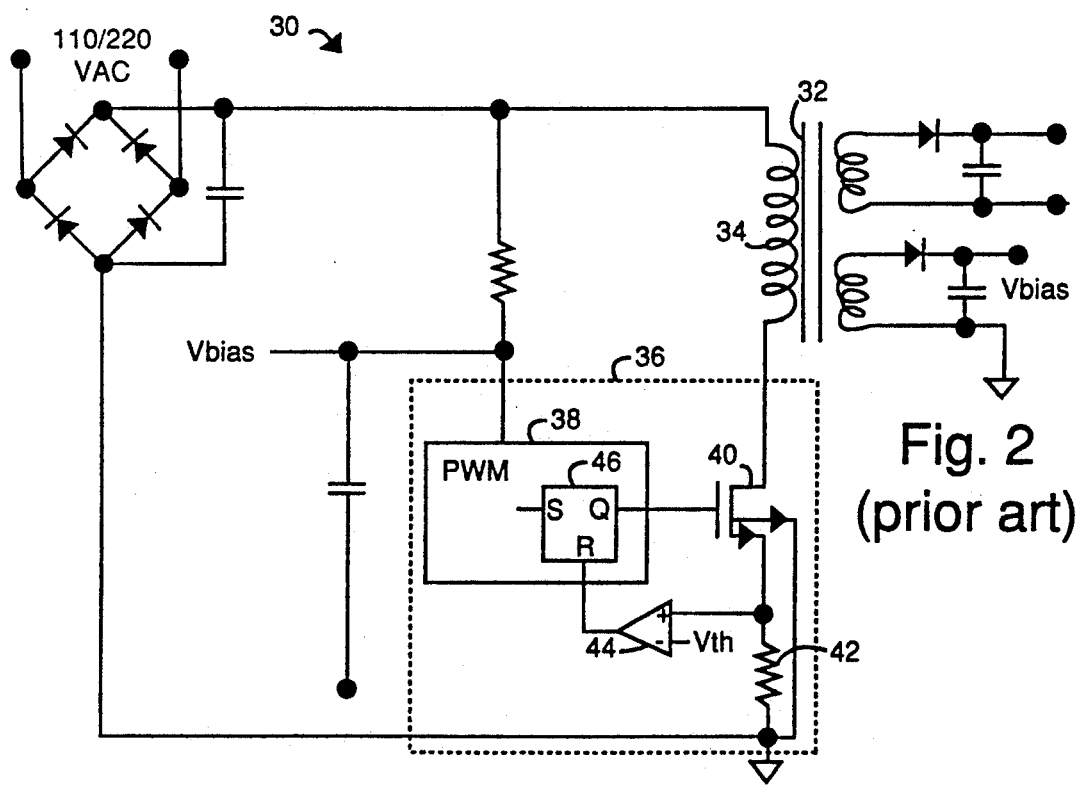
FIG. 2 is a schematic diagram of another prior art power supply that includes a sense resistor in series with one of two sources of a power switching MOSFET to implement safe operating area protection.
Figure 3:
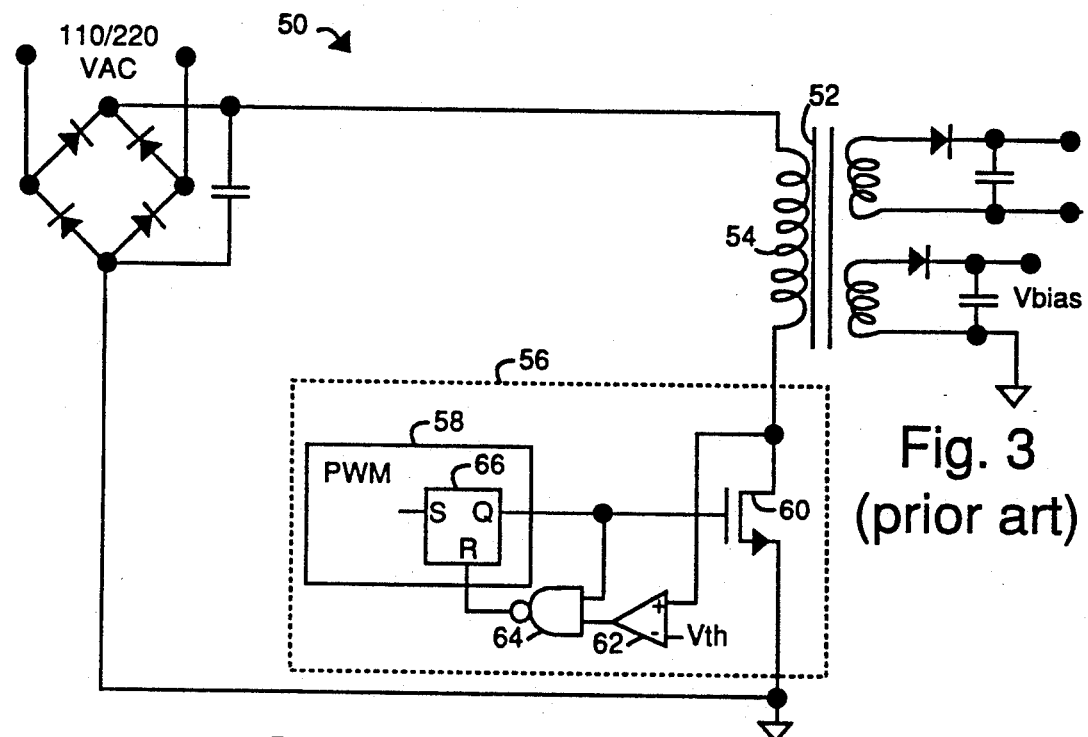
FIG. 3 is a schematic diagram of a third prior art power supply that samples the drain voltage a power switching MOSFET to implement safe operating area protection.
Figure 4:
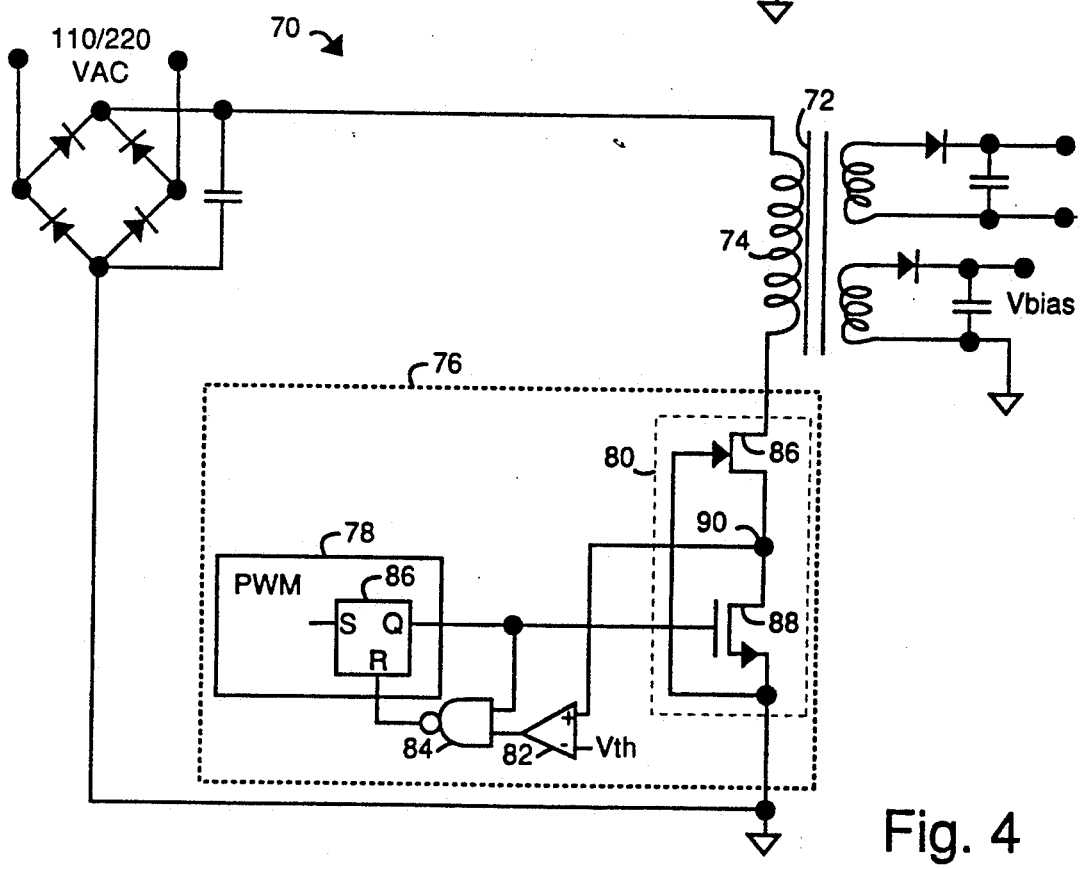
FIG. 4 is a schematic diagram of a switched mode power supply of the present invention.

FIG. 4 illustrates a power supply embodiment of the present invention, referred to by the general reference numeral 70. Power supply 70 comprises an output transformer 72 with a primary winding 74, and a switched mode power supply chip 76 that comprises a pulse width modulation (PWM) circuit 78, a high-voltage MOSFET 80, a current-limit comparator 82 and an AND-gate 84. The voltage on the drain of MOSFET 80 can be sampled during the periods MOSFET 80 is on to sense an over current condition. AND-gate 84 will only allow comparator 82 to switch off MOSFET 80 if the comparison at the inputs of comparator 82 is being made when the gate of MOSFET 80 is high.

MOSFET 80 is preferably similar to that described in U.S. Pat. No. 4,811,075, issued Mar. 7, 1989, to Klas H. Eklund. An insulated-gate, field-effect transistor (IGFET) and a double-sided, junction-gate field-effect transistor (JFET) are connected in series on the same semiconductor chip to form a high-voltage MOS transistor. An extended drain region is formed on top of a substrate of opposite conductivity material. A top layer of material, similar to the substrate, is formed by ion implantation through the same mask window as the extended drain region. The top layer covers only a middle part of the extended drain which has ends that meet with a silicon dioxide layer above. Current flow through the extended drain is controlled by the substrate and top layer which pinch-off the extended drain between them in a familiar field-effect fashion.

The drift region of MOSFET 84 is used to drop the high line voltage to low voltage for comparator 82. MOSFET 84 comprises the equivalent of a JFET 86 and an IGFET 88. A junction between the JFET 86 and IGFET 88 is a node 90, which is limited to 15-20 volts, due to the pinch-off action of JFET 86. Therefore, the drift region of MOSFET 80 is used to isolate the high line voltage from the current sense comparator 82. When MOSFET 80 is on, the current through IGFET 88 will produce a sense voltage at node 90 that is proportional to the drain on resistance ($R_{DON}$) of IGFET 88. Since IGFET 88 is traditionally the element that will limit the maximum available current to $I_{DSS}$, the configuration of power supply 70 also allows for sensing a saturation condition. Since the voltage on node 90 is limited to low voltages (typically 15 to 20 V), comparator 82 is relatively easy to implement with a low voltage process.

Figure 5:
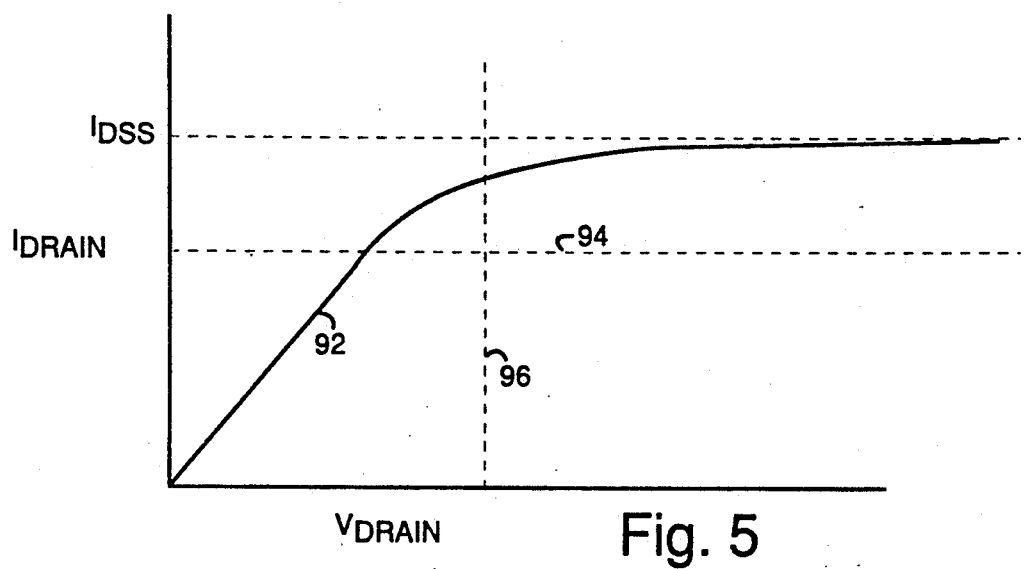

FIG. 5 illustrates the reason that the voltage threshold Vth tolerance in chip 76 is not very critical. The voltage along a curve 92 at node 90 rises rapidly when the current approaches the $I_{DSS}$ of MOSFET 80. The prior art required a preset limit represented by a line 94 to trigger current limiting circuitry. Since the present invention monitors the drain voltage ($V_{drain}$) and not the drain current ($I_{drain}$) of IGFET 88, the slope of curve 92 is steeper in terms of voltage, and this forgives some voltage inaccuracies because they will translate into only minor current cutoff inaccuracies. Therefore, it is possible to have significantly reduced margins that allow for use of the maximum current capability of MOSFET 80. Since precision is not important, comparator 82 with input threshold voltage Vth can be replaced by a simple inverter that has an input switching threshold voltage of 2.5 volts. For an 800 volt MOSFET 80, IGFET 88 represents approximately 20% of the total $R_{DON}$. Therefore, the over-current protection will be triggered at a drain voltage of approximately 12.5 volts. At such a drain voltage, the transistor in the technology used is typically well within the safe operating area rating.

Figure 6:
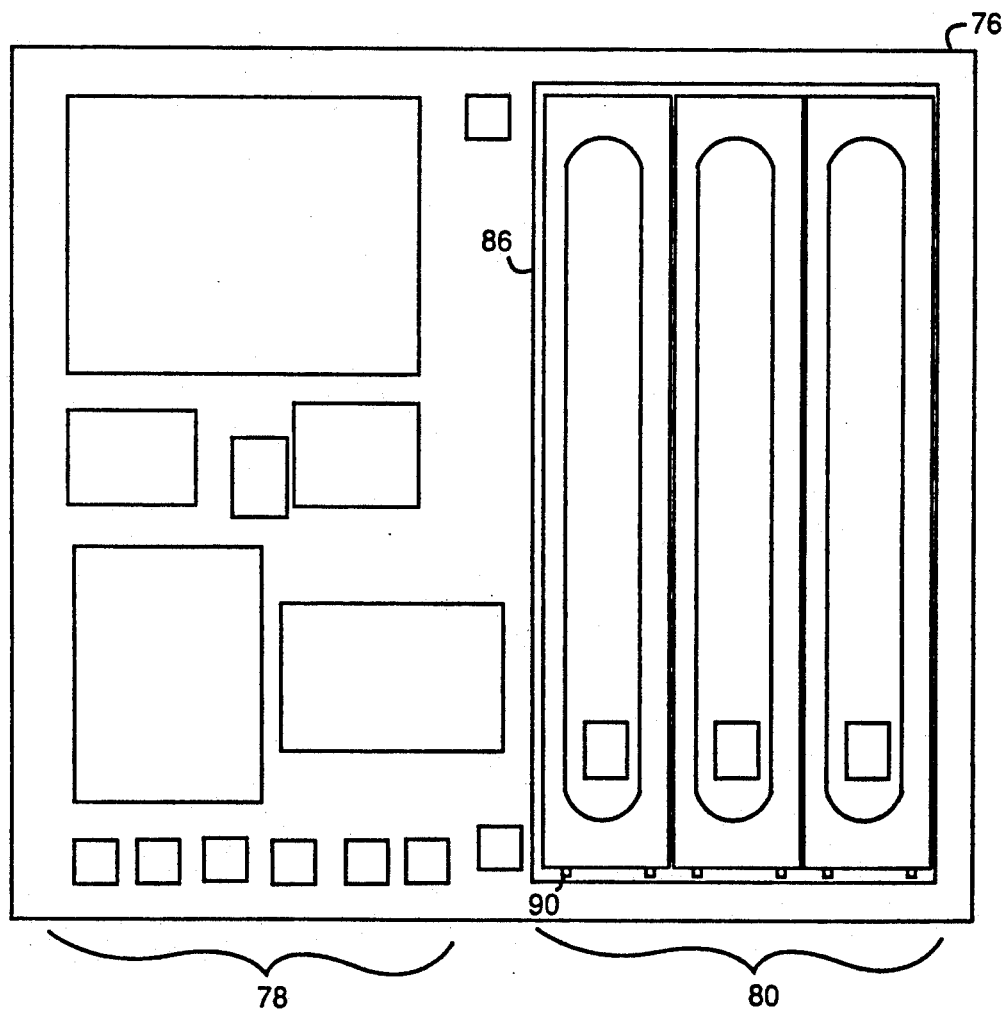
FIG. 6 is a diagram representing the chip area layout of the chip used in the power supply of FIG. 4.

FIG. 6 illustrates relatively the large amount of chip real estate that is required by high voltage MOSFET 92. JFET 86 consumes the greatest share of space.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A switched mode power supply chip, comprising:

power switching means for switching a primary winding current of a switched mode power supply transformer on and off, the power switching means comprising a first transistor for limiting the voltage applied to a drain of a second transistor;

a low voltage tap connected to said drain of said second transistor such that a sense voltage proportional to a current passing through said first and second transistors is output from the low voltage tap when said first and second transistors are turned on; and comparator means for disabling the power switching means whenever said sense voltage exceeds a predetermined maximum wherein the power switching means is operated in its safe operating area.

2. The chip of claim 1, wherein:

the power switching means is a MOSFET device and said first transistor is a JFET with a grounded gate and said second transistor is an IGFET with a grounded source.

3. The chip of claim 1, wherein:

the comparator means comprises an inverter with an input switching threshold of approximately 2.5 volts and a flip-flop that is reset by said inverter and that drives a gate of said second transistor.

4. The chip of claim 1, wherein:

the power switching means is a MOSFET device and said first transistor is a JFET with a grounded gate and said second transistor is an IGFET with a grounded source; and the comparator means comprises an inverter with an input switching threshold of approximately 2.5 volts and a flip-flop that is reset by said inverter and that drives a gate of said IGFET.

5. An integrated circuit (IC) with safe operating area protection, the IC comprising:

power switching means for switching a high voltage output current connected to the IC on and off, the power switching means including a first transistor for limiting a voltage applied to a drain of a second transistor;

a low voltage tap connected to said drain of said second transistor such that a sense voltage proportional to a current passing through said first and second transistors is output from the low voltage tap when said first and second transistors are turned on; and comparator means for disabling the power switching means whenever said sense voltage exceeds a predetermined maximum wherein the power switching means is operated in its safe operating area.

* * * * *